United States Patent
Storasta et al.

(10) Patent No.: US 10,109,725 B2
(45) Date of Patent: Oct. 23, 2018

(54) REVERSE-CONDUCTING SEMICONDUCTOR DEVICE

(71) Applicant: ABB Schweiz AG, Baden (CH)

(72) Inventors: Liutauras Storasta, Lenzburg (CH); Chiara Corvasce, Bergdietikon (CH); Manuel Le Gallo, Wallisellen (CH); Munaf Rahimo, Uezwil (CH); Arnost Kopta, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/630,491

(22) Filed: Jun. 22, 2017

(65) Prior Publication Data

US 2017/0294526 A1    Oct. 12, 2017

Related U.S. Application Data

(63) Continuation of application No. PCT/EP2015/080947, filed on Dec. 22, 2015.

(30) Foreign Application Priority Data

Dec. 23, 2014 (EP) .................................. 14200101

(51) Int. Cl.
    *H01L 29/66*    (2006.01)
    *H01L 29/739*   (2006.01)
    (Continued)

(52) U.S. Cl.
    CPC ........ *H01L 29/7395* (2013.01); *H01L 29/063* (2013.01); *H01L 29/0615* (2013.01);
    (Continued)

(58) Field of Classification Search
    CPC ............. H01L 29/7395; H01L 29/0615; H01L 29/0619; H01L 29/063; H01L 29/0692;
    (Continued)

(56) References Cited

U.S. PATENT DOCUMENTS 8,212,283 B2   7/2012 Storasta et al.
2010/0187567 A1*  7/2010 Tanabe ................ H01L 29/0615
                                                            257/140
(Continued)

FOREIGN PATENT DOCUMENTS

DE   112013004846 T5   6/2015
EP       0651435 A1    5/1995
(Continued)

OTHER PUBLICATIONS

European Patent Office, International Search Report and Written Opinion issued in corresponding Application No. PCT/EP2015/080947, dated Mar. 17, 2016, 13 pp.
(Continued)

*Primary Examiner* — Mark Tornow
(74) *Attorney, Agent, or Firm* — J. Bruce Schelkopf; Taft Stettinius & Hollister LLP

(57) ABSTRACT

A reverse-conducting MOS device is provided having an active cell region and a termination region. Between a first and second main side. The active cell region comprises a plurality of MOS cells with a base layer of a second conductivity type. On the first main side a bar of the second conductivity type, which has a higher maximum doping concentration than the base layer, is arranged between the active cell region and the termination region, wherein the bar is electrically connected to the first main electrode. On the first main side in the termination region a variable-lateral-doping layer of the second conductivity type is arranged. A protection layer of the second conductivity type is arranged in the variable-lateral-doping layer, which protection layer has a higher maximum doping concentration than the maximum doping concentration of the variable-lateral-doping layer in a region attached to the protection layer.

20 Claims, 7 Drawing Sheets

(51) Int. Cl.
*H01L 29/78* (2006.01)
*H01L 29/06* (2006.01)
*H01L 29/10* (2006.01)
*H01L 29/36* (2006.01)
*H01L 29/40* (2006.01)
*H01L 29/08* (2006.01)

(52) U.S. Cl.
CPC ...... *H01L 29/0619* (2013.01); *H01L 29/0692* (2013.01); *H01L 29/0696* (2013.01); *H01L 29/0865* (2013.01); *H01L 29/1004* (2013.01); *H01L 29/1095* (2013.01); *H01L 29/36* (2013.01); *H01L 29/402* (2013.01); *H01L 29/7811* (2013.01); *H01L 29/7819* (2013.01); *H01L 29/7823* (2013.01); *H01L 29/0834* (2013.01)

(58) Field of Classification Search
CPC ............ H01L 29/0696; H01L 29/0865; H01L 29/1004; H01L 29/1095; H01L 29/36; H01L 29/402; H01L 29/7811; H01L 29/7819; H01L 29/7823; H01L 29/0834
USPC ........................................................ 257/139
See application file for complete search history.

(56) References Cited

U.S. PATENT DOCUMENTS

| | | |
|---|---|---|
| 2012/0043581 A1* | 2/2012 | Koyama ............. H01L 29/0696 257/140 |
| 2013/0037805 A1 | 2/2013 | Senoo |
| 2013/0099279 A1 | 4/2013 | Storasta et al. |
| 2015/0255535 A1* | 9/2015 | Taguchi ............. H01L 29/7395 257/488 |
| 2016/0163696 A1* | 6/2016 | Takahashi .......... H01L 27/0635 257/140 |

FOREIGN PATENT DOCUMENTS

| | | |
|---|---|---|
| JP | 2014038937 A | 2/2014 |
| WO | 2014054319 A1 | 4/2014 |

OTHER PUBLICATIONS

Chen et al., "A snapback suppressed reverse-conducting IGBT with built-in diode by utilizing edge termination," Superlattices and Microstructures, vol. 70 (2014), pp. 109-116.

\* cited by examiner

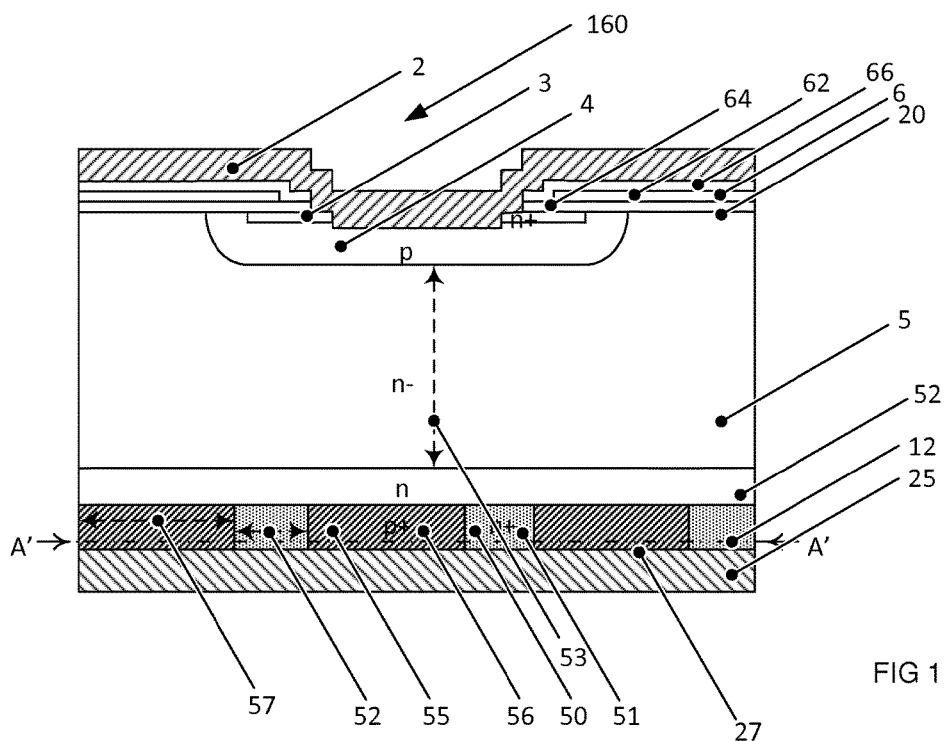
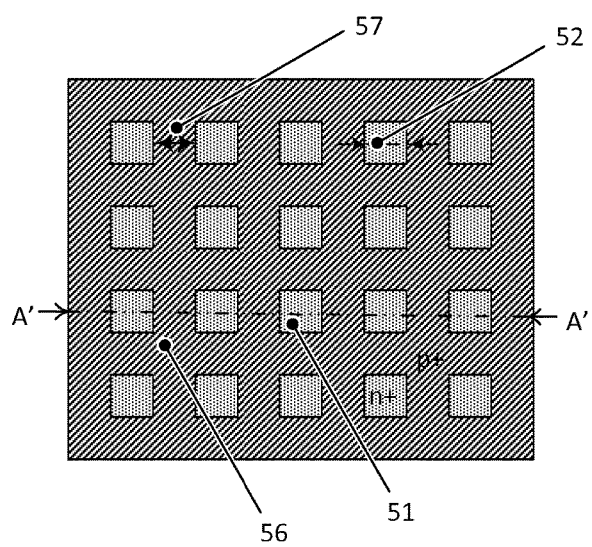
FIG 1 Prior Art
FIG 2 Prior Art

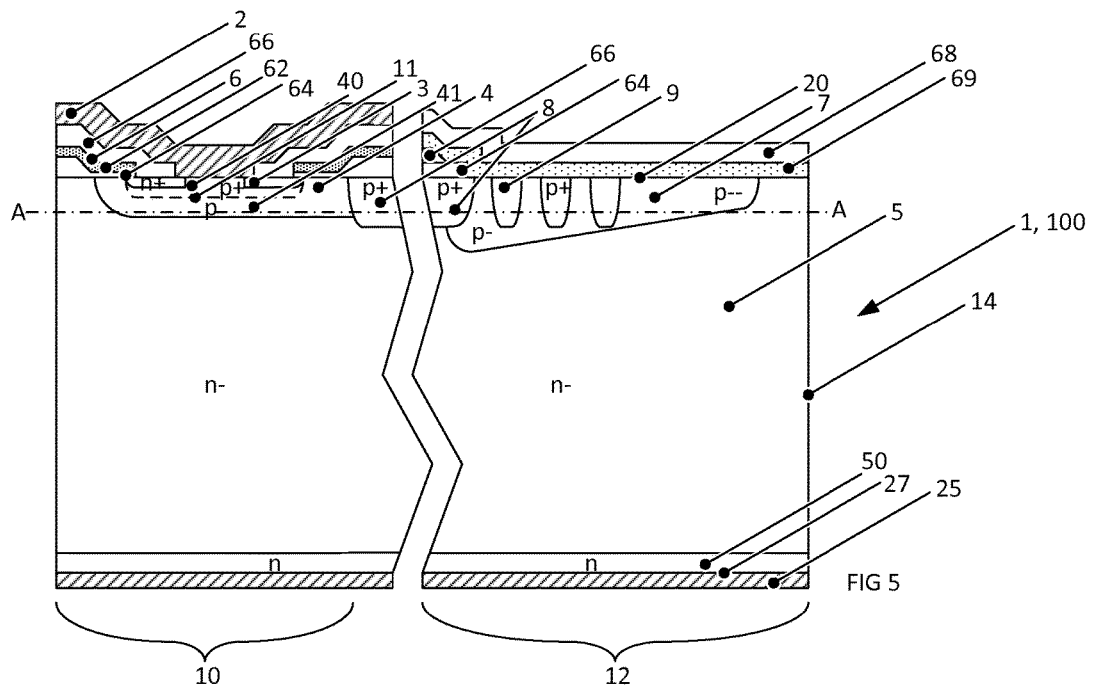
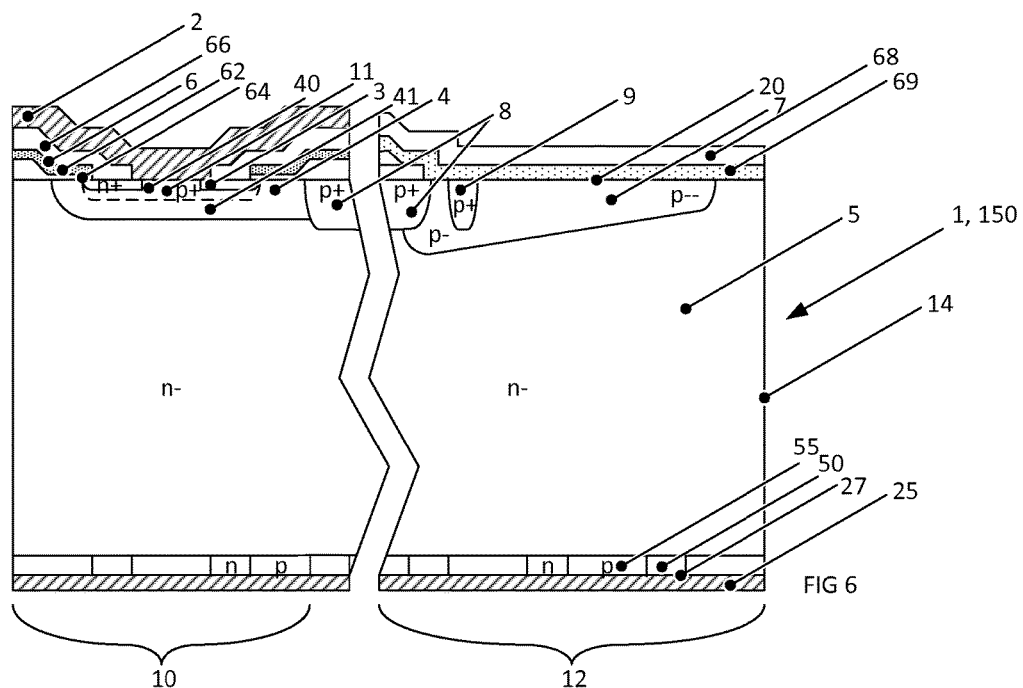

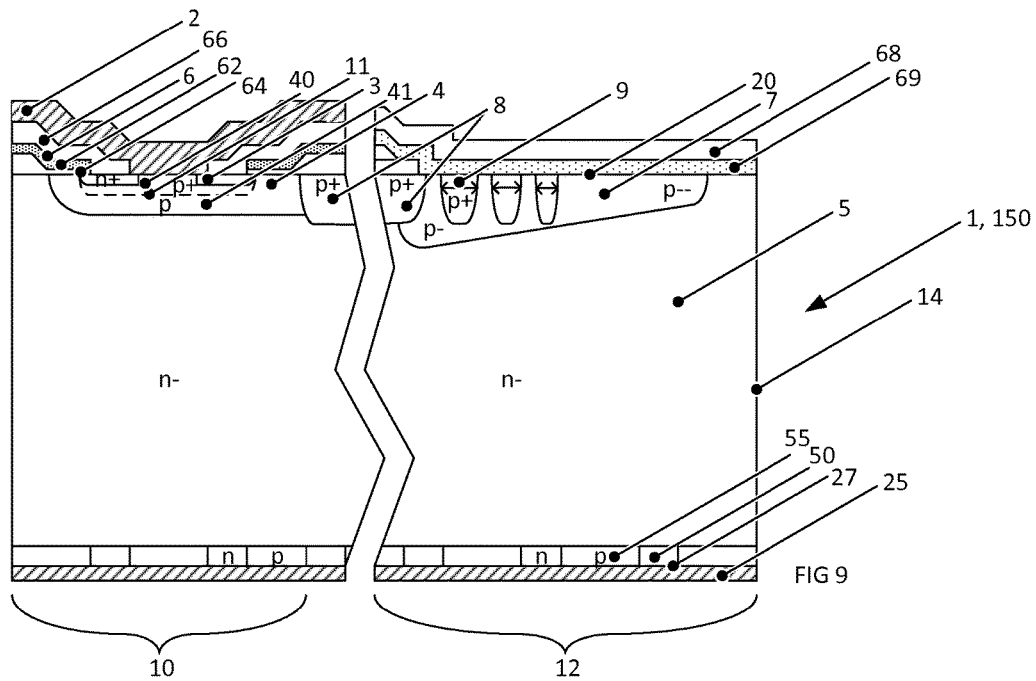
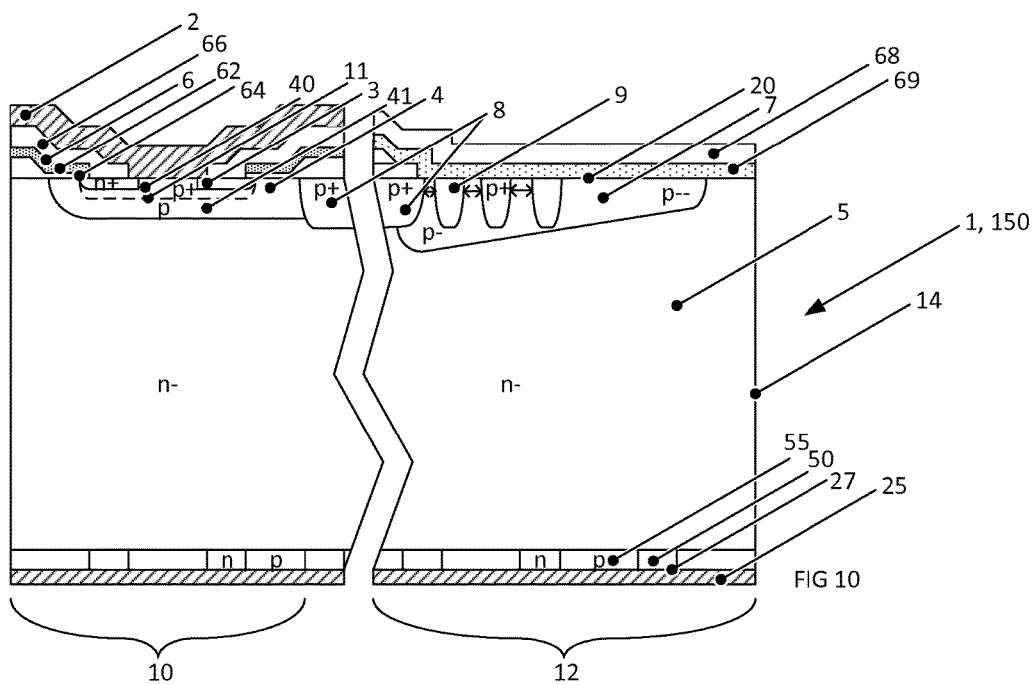

REVERSE-CONDUCTING SEMICONDUCTOR DEVICE

TECHNICAL FIELD

The invention relates to the field of power electronics and more particularly to a reverse-conducting MOS device according to the preamble of claim 1.

BACKGROUND ART

In U.S. Pat. No. 8,212,283 B2 a prior art reverse-conducting insulated gate bipolar transistor (RC-IGBT) in form of a Bi-mode Insulated Gate Transistor (BIGT) 160 is described (shown in FIG. 1), which comprises a freewheeling diode and an insulated gate bipolar transistor (IGBT) on a common semiconductor chip, part of which chip forms the (n−) doped drift layer 5 with a drift layer doping concentration and a drift layer thickness 53. The RC-IGBT comprises an anode side 27 (second main side) and a cathode side 20 (first main side), whereas the anode side 27 is arranged opposite of the cathode side 20 of the chip.

The drift layer thickness 53 is the maximum vertical distance between the anode and cathode side 27 and 20 of that part of the chip with the drift layer doping concentration.

An n doped source region 3, a p doped base layer 4 and a gate electrode 6 having an electrically conductive gate layer 62 and an insulating layer (comprising a first and second insulating layer 64, 66), which insulates the gate layer 62 from any doped layer, and a cathode electrode 2 (first main electrode), are arranged at the cathode side 20.

The reverse-conducting semiconductor device comprises an active cell region 10, which is an area in the chip, which includes and is arranged below any of the source region 3, base layer 4 or gate layer 62.

In such a BIGT, an n doped first layer 50 of higher doping concentration than the drift layer doping concentration of the drift layer and a p doped anode layer 55 are alternately arranged on the anode side 27. The first layer 50 comprises at least one or a plurality of n doped first regions 51, wherein each first region has a first region width 52. Each first region width 52 is smaller than the drift layer thickness 53.

The anode layer 55 comprises at least one or a plurality of p doped second regions 56 and at least one or a plurality of p doped pilot regions 58, wherein each second region 56 has a second region width 57 and each pilot region 58 has a pilot region width 59 (FIG. 3). The at least one second region 56 is that part of the anode layer 55, which is not the at least one pilot region 58 (which will be defined in the following).

A mixed region comprises the at least one first and second regions 51, 56. The mixed region is arranged between the pilot region 58 and the active region border and has a width of at least once the base layer thickness 53. FIG. 2 shows a cut through the line A'-A' of FIG. 1 showing such a mixed region.

Any region (first, second or pilot region) has a region width and a region area, which is surrounded by a region border. A shortest distance shall be the minimum length between a point within said region area and a point on said region border. Each region width is defined as two times the maximum value of all (i.e. any possible) shortest distances within said region.

Each pilot region area is a p doped area, in which any two first regions 51, which are arranged on the border of the pilot region 58, have a distance between two neighboured first regions 51 on the pilot region border smaller than two times the drift layer thickness 53. The pilot region width 59 is at least two times the drift layer thickness 53. In an exemplary embodiment, the drift layer thickness 53 is at least 100 μm (for a device of about 1200 V), at least 300 μm (for a device of about 2500 V) and at least 500 μm (for a device of about 4500 V). Thus, the pilot region width is at least 200 μm, at least 600 μm or at least 1000 μm. The total area of the at least one pilot region 58 is between 10% and 30% of the area of the active region.

The pilot region 58 is laterally surrounded on the pilot region border by first regions 51, which have a distance from each other of less than two times the drift layer thickness 53, exemplarily smaller than once the drift layer thickness 53. No n doped region 51 is enclosed in this p doped pilot region 58. That means that the at least one first region 51 surrounds the at least one pilot region 58 in a plane parallel to the anode side 27 such that an n doped area (i.e. first region(s)), which has at least one opening (i.e. in which p doped second regions 56 are arranged) of less than two times the drift layer thickness 53 or which has no such openings, surrounds the at least one pilot region 58. This shall include the option that the first region 51 is a continuous region surrounding the pilot region 58 in a plane parallel to the anode side 27 or by having a first region 51 formed as an open ring having an opening smaller than two times the drift layer thickness 53. By having an n doped area around the pilot region 58, p doped areas have a width of less than two times the drift layer thickness 53 (and thus form second regions 56) are arranged.

In the pilot region 58, no first region is arranged or enclosed. Across the pilot region 58 (i.e. on the pilot region border), the first regions 51 have a distance of more than two times the drift layer thickness 53. That means that the pilot region 58 may be enclosed by first regions 51 which have a smaller distance to each other, but across the pilot region area, the distance between any two first regions 51 is larger than two times the drift layer thickness 53. In other exemplary embodiments, each pilot region area has a width larger than 2.5, in particular 3 times or 4 times the drift layer thickness 53.

The pilot region has a pilot region area such that a circle (p doped area) having a diameter of at least two times the drift layer thickness 53 can be laid into the pilot region over the whole region area in a plane parallel to the anode side 27.

The at least one pilot region 58 is arranged in the central part of the active region 10 in such a way that there is a minimum distance between the pilot region border to the active region border 580 of at least one time the drift layer thickness 53 (FIG. 3). The pilot region 58 represents a pilot IGBT region, which is surrounded by shorted regions with alternating first and second doped regions 51, 56 (mixed region). The at least one pilot region 58 is arranged in the central part of the device such that the mixed region laterally surrounds the at least one pilot region 58.

By the introduction of the pilot region 58 with much increased dimensions compared to the first and second regions 51, 56, a region is created which is dedicated as sole IGBT region and not operating in the diode mode. The p-type pilot region 58 ensures snap-back free operation of the BIGT. The pilot region 58 can also be used to give more freedom to determine the IGBT to diode area ratio and decouple this design aspect from the standard approach involving the small second regions 56 only.

The pilot region 58 represents a pilot IGBT region, which eliminates snap-back effects at low currents. The snap-back effect of a BIGT depends on the resistance of the drift layer, which in turn depends on the resistivity and thickness of the drift layer 53. For devices having a greater drift layer thickness 53, the voltage drop across the drift layer is larger. Therefore, also the total on-state voltage drop is higher for such devices, and snap-back effect occurs at higher voltages.

The introduction of a sufficiently large p doped region (pilot region) can avoid such snap-back effect in a high voltage IGBT device. A minimum distance between this pilot region 58 and the border of the active region is essential for good thermal performance and improvement of the device SOA since the pilot IGBT does not include transition parts of the chip such as those from active to termination regions. Furthermore, by using a pilot region 58, snap-back behaviour is improved compared to distributed smaller pilot regions.

The first and second regions 51, 56 form the main shorted region in which the silicon area included is utilized in both IGBT and diode mode.

The n doped anode shorts (first layer) conduct electron current during the turn-off and give rise to the FCE effect which greatly improves turn-off softness of the BIGT device.

In a prior art reverse conducting (RC)-IGBT or BIGT device the p-base layers of the MOS cells are utilized as anode regions of the internal freewheeling PIN diode. The MOS cells are terminated at the termination region with deeper and higher doped p-bars, which also act as additional diode anode regions. These additional p-bars are not shorted by the MOS channel and are therefore essential for achieving snap-back free diode mode characteristics, as is described in the patent application US 2013/0099279 A1. However, the SOA of the freewheeling diode is affected strongly by the design of the p-bars contact with the termination region in the areas around the active area of the BIGT/RC-IGBT.

The standard design of the RC IGBT and BIGT uses the additional p-bars which are diffused deeper and are higher doped compared to the p-base layer of the MOS cell. They contact the p base layer in an area, in which no MOS channel is formable.

When the freewheeling diode is conducting, the p-bars and termination act as anode regions and inject holes into the n-drift layer. During reverse recovery the electrical field maximum is near the deep and highly doped p-bars, and as a result the reverse current becomes concentrated in these areas. Thus, a current filament, in which holes are highly concentrated in a small area, is created at the curvature of the p-bar. As a result of this, a locally high temperature is created in the filament which might lead to device destruction and therefore lowers the diode mode SOA as shown by Prior art curve in the thermodynamic simulation (FIG. 4).

Chen shows in "A snapback suppressed RC-IGBT with built-in diode by utilizing edge termination" Superlattices and Microstructures, vol. 70, 109-116 a prior art RC-IGBT having in a central region a pure IGBT region. This IGBT region is surrounded by a pure diode region, which is established between a p doped bar, which is electrically connected to the cathode electrode, and an n doped layer on the second main side. In a termination region surrounding the diode region, field ring are arranged, which have the same depth as the p bar. These field ring structure has a width of 280 µm, which great width is needed for the reduction of the electric field.

WO 2014/054319 A1 shows an IGBT, which comprises on the first main side p doped diffused regions, which have increased distance to each other with increasing distance from the active cell region. The inner p regions close to the active cell region are connected to the cathode electrode, whereas in the outer region the p regions are separated from each other by the drift layer, so that they function as field rings.

For terminating an electric field with such isolated field ring structures, a larger number of field rings are needed, which together with the distance between the field rings results in a wide termination region.

DISCLOSURE OF INVENTION

It is an object of the invention to provide a reverse-conducting MOS device having an improved turn-off capability of the device in diode mode.

This object is achieved by a reverse-conducting MOS device according to claim 1.

The inventive reverse-conducting MOS device has a first main electrode on a first main side and a second main electrode on a second main side opposite to the first main side. The device has an active cell region and a termination region laterally surrounding the active cell region up to an edge of the device. The active cell region comprises a plurality of MOS cells, each of which comprises between the first main and second main side a source layer of a first conductivity type, a base layer of a second conductivity type, which is different from the first conductivity type, a drift layer of the first conductivity type and a first layer of the first conductivity type, which is higher doped than the drift layer. In each MOS cell a gate electrode is arranged on the first main side.

On the first main side a bar of the second conductivity type, which has a higher maximum doping concentration than the base layer, is arranged between the active cell region and the termination region and encloses the active cell region in a plane parallel to the first main side. The bar is electrically connected to the first main electrode via the base layer of the second conductivity type or by direct contact.

On the first main side in the termination region a variable-lateral-doping layer of the second conductivity type is arranged, in which for all depths in the variable-lateral-doping layer the doping concentration decreases towards the edge of the device. The variable-lateral-doping layer is connected to the bar so that avalanche can start at the bar and spread then towards a protection layer through the variable-lateral-doping layer.

On the first main side a protection layer of the second conductivity type is arranged in the variable-lateral-doping layer, which protection layer has a higher maximum doping concentration than the maximum doping concentration of the variable-lateral-doping layer in a region attached to the protection layer.

Due to the additional p-bars high turn-off capability of the IGBT can be obtained and snap-back free characteristics in the diode mode can be enabled.

The VLD layer is used for reducing the electric field in the termination region. As the VLD layer is connected to the bar and as the protection layer is embedded in the VLD layer, the electric field is reduced in a small distance, i.e. the need to have a wide field ring structure.

Due to the introduction of the highly doped protection layer the holes are directed not into a small spot area at the interface between the bar and the variable-lateral doping-layer, but they are spread more widely within the protection layer and an additional resistance is introduced into the filament path which reduces the filament current. This effect can further be enhanced by having a protection layer with a plurality of protection regions, exemplarily by having ring-shaped regions (protection rings) surrounding the active cell region, each of which encloses the active cell region and which separated from each other by the lower doped VLD layer. The protection regions, which are farer away from the bar region, enclose the protection regions, which are nearer to the bar region, in a plane parallel to the first main side. By the protection regions being embedded in the VLD layer, in planes parallel to the first main side, a modulated doping profile (of the second conductivity type) is achieved, in which at the protection regions a higher doping concentration is present than at the VLD layer in-between such protection regions. In an exemplary embodiment, the device has up to 5 protection rings or between 3 and 5 protection rings as protection regions.

This effect results in a drastic reduction of the maximum temperature in the termination region, i.e. in the filament as shown in FIG. 4. Inventive RC-IGBT1 contains five protection regions with decreasing widths and Inventive RC-IGBT2 contains two protection regions with constant widths. At the same voltage and current as for the prior art device, the hole current is spread out and does not focus into a narrow filament. As a result, peak temperature in the device is reduced which in turn provides much better turn-off capability of the diode and much better SOA performance in diode mode is achievable.

The invention combines the advantage of keeping the temperature low in the device with a small termination width (i.e. having a small width in a direction of increasing distance from the active cell region).

The invention can be applied to reverse conducting MOS devices, i.e. to devices having a MOS cell and enabling reverse conducting mode. That means for a MOS with an n– MOS channel an n doped first layer is arranged on the second main side and for a p– MOS a p doped first layer is arranged on the second main side. Such an inventive RC MOS device can be a MOSFET or a RC-IGBT. The RC-IGBT may also be designed as a BIGT.

Further preferred embodiments of the inventive subject matter are disclosed in the dependent claims.

BRIEF DESCRIPTION OF DRAWINGS

The subject matter of the invention will be explained in more detail in the following text with reference to the attached drawings, in which:

FIG. 1 shows a cross sectional view on a prior art reverse-conducting IGBT;

FIG. 2 shows a plan view of the structures of first and second regions of a prior art reverse-conducting IGBT;

FIG. 5 shows a cross sectional view on an inventive reverse-conducting MOSFET having three protection regions;

FIG. 6 shows a cross sectional view on an inventive reverse-conducting IGBT having one protection region;

FIG. 9 shows a cross sectional view on an inventive reverse-conducting IGBT having protection regions with decreasing widths;

FIG. 10 shows a cross sectional view on an inventive reverse-conducting IGBT having protection regions with increasing distance between neighbored protection regions;

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 3:
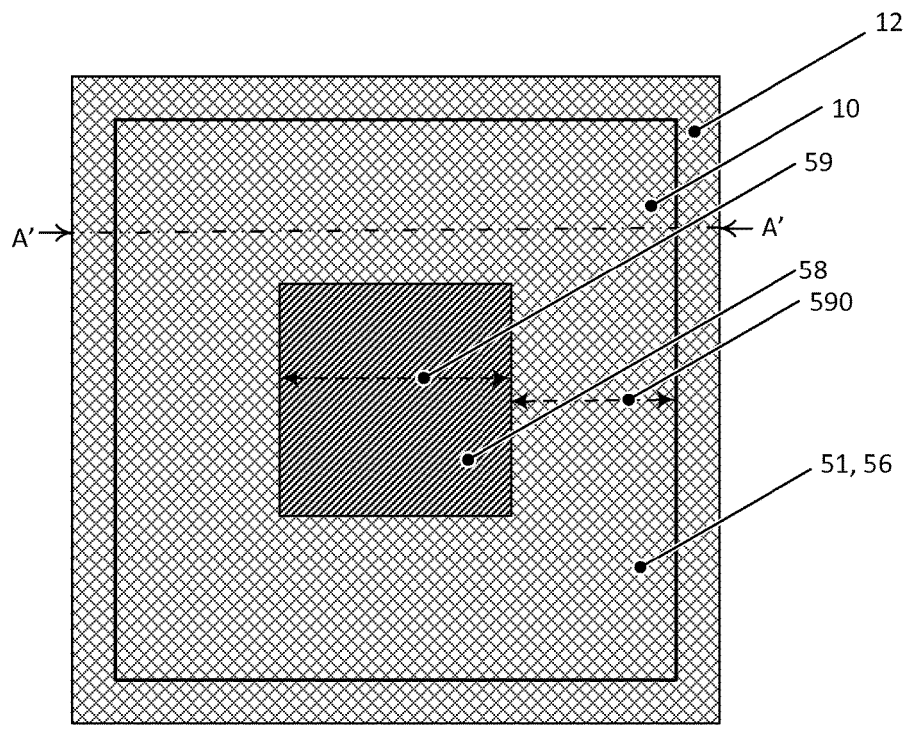
FIG. 3 shows a plan view of the structures of first and second regions of another prior art reverse-conducting IGBT.
Figure 4:
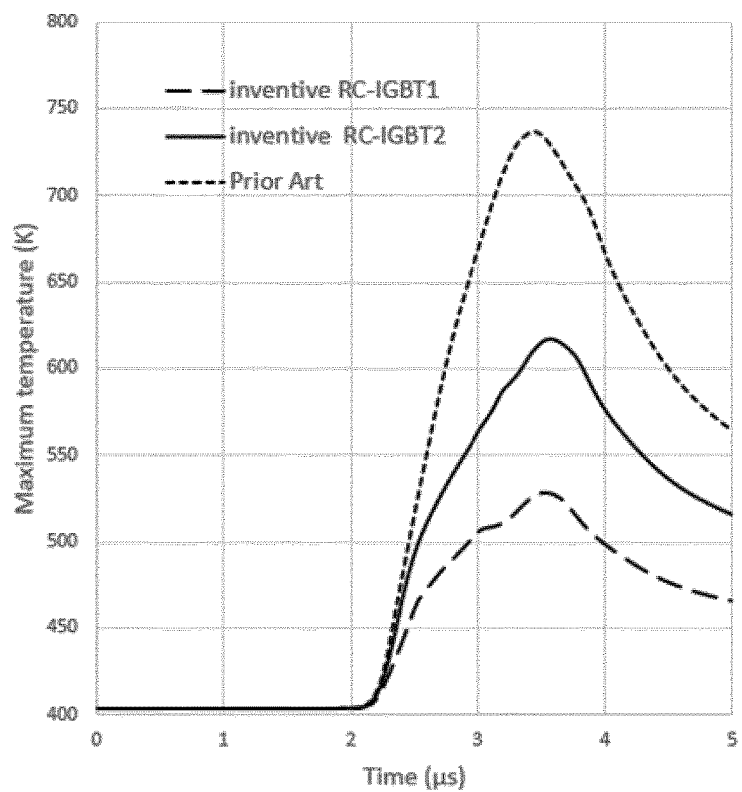
FIG. 4 Time dependence of the temperature in the filament of a prior art device and an inventive devices during diode mode turn-off.
Figure 7:
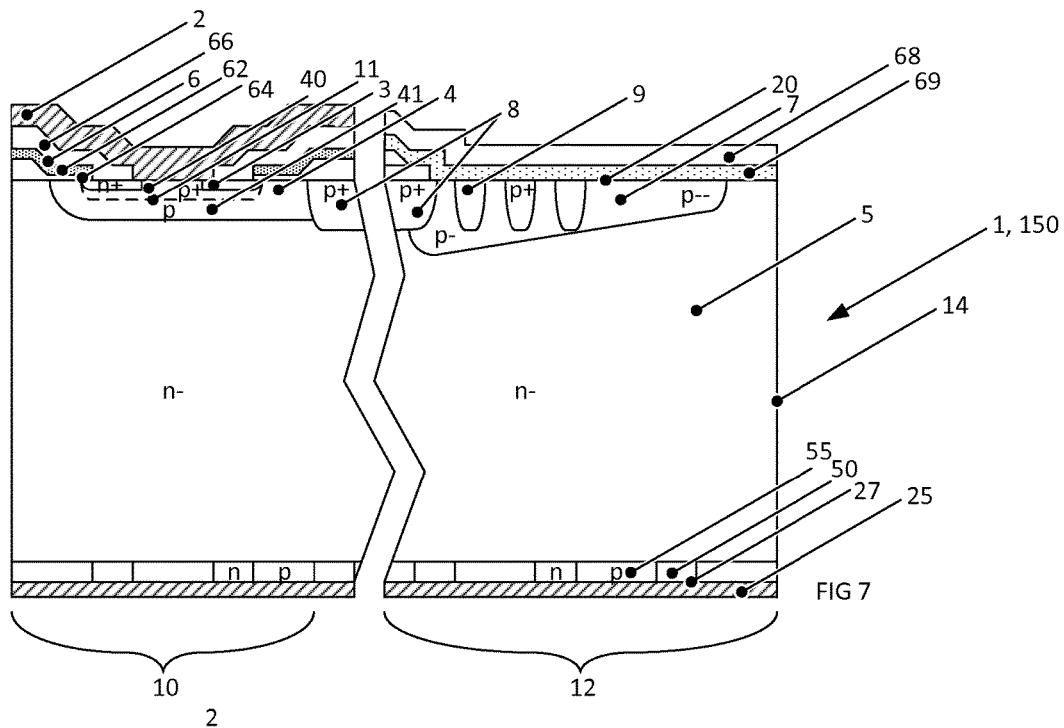
FIG. 7 shows a cross sectional view on an inventive reverse-conducting IGBT having three protection regions.

In FIG. 5 a first embodiment of an inventive reverse-conducting (RC) MOS (metal oxide semiconductor) device 1 in form of a metal-oxide-semiconductor field-effect transistor (MOSFET) 100 is shown. The MOSFET 100 comprises a first main electrode 2, which is a source electrode for a MOSFET, on a first main side 20 and a second main electrode 25, which is a drain electrode for the MOSFET 100, on a second main side 27 opposite to the first main side 20. The device has an active cell region 10 (central region, which shall be a MOS cell region, i.e. such region, in which the MOS cells 11 are arranged) and a termination region 12 laterally surrounding the active cell region 10 up to an edge 14 of the device. The edge is arranged as the surface of the device between the first and second main side 20, 27 of the device. The first main side 20 shall be the surface of the doped layers on the side towards the first main electrode 2. It shall be a plain plane farthest away from the second main electrode 25.

The active cell region 10 (MOS cell region) comprises a plurality of MOS cells 11, each of which comprises between the first main and second main side 20, 27 an n doped source layer 3, a p doped base layer 4, an (n–) doped drift layer 5 and an n doped first layer 50, which is higher doped than the drift layer (5). The first layer is a drain layer for the MOSFET 100.

The at least one source region 3, the gate layer 5 and the insulating layer 6 are arranged such that an opening is available above the base layer 4, at which opening the base and source layer 4, 3 contact a source electrode 2. The opening is surrounded by the at least one source layer 3, the gate layer 5 and the insulating layer.

The active cell region 10 is the area in which the device conducts current during on-state, in the case of a RC-IGBT or a MOSFET, this is the MOS cell(s) 11. The device may comprise one or more MOS cells 11. In each MOS cell 11 a gate electrode 6 is arranged on the first main side 20. The MOS cell shall be an area having a MOS structure on the first main side with a gate electrode 6 and a source layer 3 and a base layer 4, at which layers a MOS channel is created during device operation (MOS channel, in which electrons flow from the source layer 3, through the base layer 4 to the drift layer 5).

Thus, the active cell region 10 is that area within the device, which includes the source region 3 and base layer 4 and the area, which is arranged below (in projection to) the source layer 3, base layer 4 and gate layer 62. With below the area is meant which is arranged in the device 1 between the first main side 20 and the second main side 27, in which area any of the source layer 3, base layer 4 or gate layer 62 are arranged.

The gate electrode 6 comprises an electrically conductive gate layer 62 and an insulating layer, which electrically insulates the gate layer 62 from the at least one base layer 4, the source layer 3 and the drift layer 5. Exemplarily, the gate layer 5 is embedded and completely covered by the insulating layer.

Exemplarily, the insulating layer comprises a first electrically insulating layer 64, preferably made of a silicon dioxide, and a second electrically insulating layer 66, preferably also made of a silicon dioxide. The second electrically insulating layer 66 covers the first electrically insulating layer 64. For an MOSFET 100 with a gate layer 6 formed as a planar gate electrode as shown is FIG. 1 the first electrically insulating layer 64 is arranged on top of the first main side 20. In between the first and second electrically insulating layers 64, 66, the gate layer 62 is embedded, exemplarily it is completely embedded. Thus, the gate layer 62 is separated from the drift layer 5, the source layer 3 and the base layer 4 by the first electrically insulated layer 64. The gate layer 62 is exemplarily made of a heavily doped poly-silicon or a metal like aluminum.

The gate electrode 6 may also be designed as a trench gate electrode. Again, the trench gate electrode comprises an electrically conductive layer 62 and a first electrically insulating layer 64, which surrounds and thus separates the electrically conductive layer 62 from the drift layer 5, the base layer 4 and the source layer 3. Exemplarily, a second insulating layer 66 is arranged between the electrically conductive layer 62 and the first main electrode 2. The trench gate electrode is arranged lateral to the base layer 4 in a plane parallel to the first main side 20. The trench gate electrode extends from the first main side 20 up to a trench gate electrode depth.

The first and second insulating layers 64, 66 may be made of an insulating material, wherein also a dielectric like a metal oxide, exemplarily Silicon dioxide, shall be considered as an insulating layer. The covering second insulating layer 66 can also be made as a stack of different insulating layers. In case of the insulating layer being a metal oxide layer the channel described above is called a MOS channel (metal oxide semiconductor), whereas otherwise (insulating layers 64, 66 being made of another insulating material) the channel may also be called MIS channel (metal insulator semiconductor). For the purposes of this invention MIS and MOS devices shall be called MOS devices.

As a material for the gate layer 62 any appropriate electrically conductive material like a metal or poly-silicon may be used.

The drift layer 5 is an (n−) doped layer of low doping concentration. Exemplarily, the drift layer 5 has a constantly low doping concentration. Therein, the substantially constant doping concentration of the drift layer 5 shall mean that the doping concentration is substantially homogeneous throughout the drift layer 5, however without excluding that fluctuations in the doping concentration within the drift layer being in the order of a factor of one to five may be possibly present due to e.g. a fluctuations. The final drift layer thickness and doping concentration is chosen due to the application needs. An exemplary doping concentration of the drift layer 5 is between $5*10^{12}$ cm$^{-3}$ and $5*10^{14}$ cm$^{-3}$.

A first main electrode 2, which is a source electrode for a MOSFET 100, is arranged on the first main side 20 within the opening so that it is in direct electrical contact to the base layer 4 and the source layer 3. This source electrode exemplarily also covers the insulating layer 64, 66, but is separated and thus electrically insulated from the gate layer 62 by the second electrically insulating layer 66.

In an exemplary embodiment, the base layer 4 comprises a base region 41 and a contact layer 40, which is higher doped than the base region 41. The contact layer 40 contacts the source electrode 2 and improves the contact properties and maximum turn-off current capability, whereas the base region 41 separates the source layer 3 form the drift layer 5. It is arranged below the contact layer 40 and laterally surrounds the contact layer 40. The contact layer 40 is shown in the figures as a dashed line to indicate that this layer is an exemplary embodiment.

Figure 13:
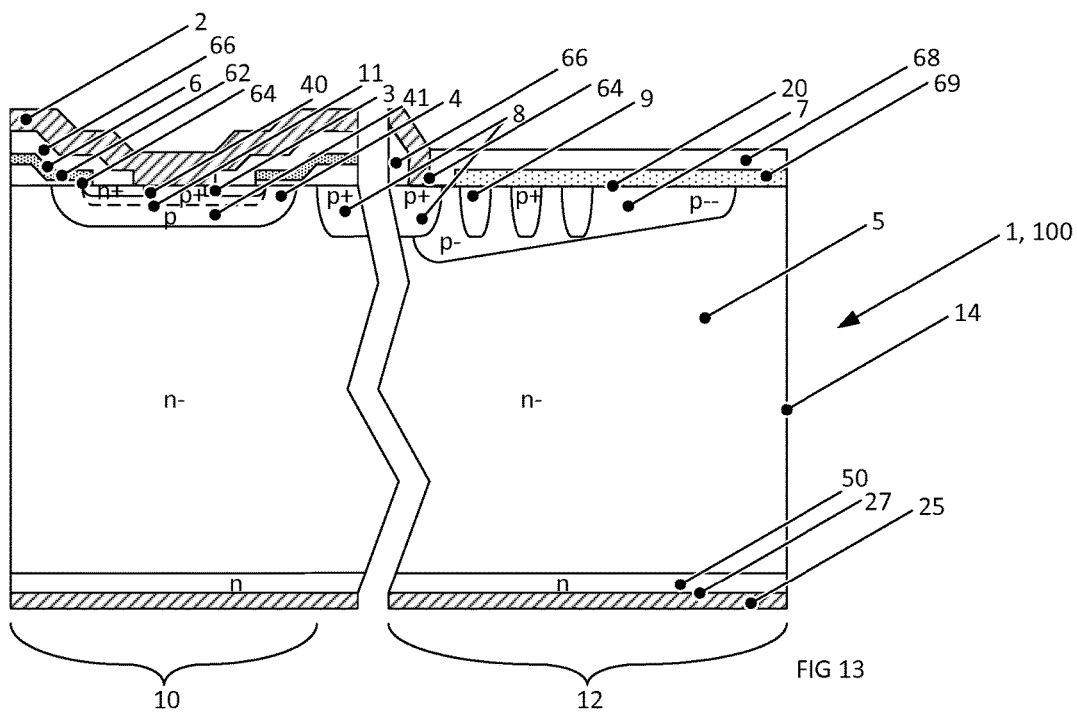
FIG. 13 shows a cross sectional view on an inventive MOSFET having a direct contact between the bar 9 and the first main electrode 2.
Figure 14:
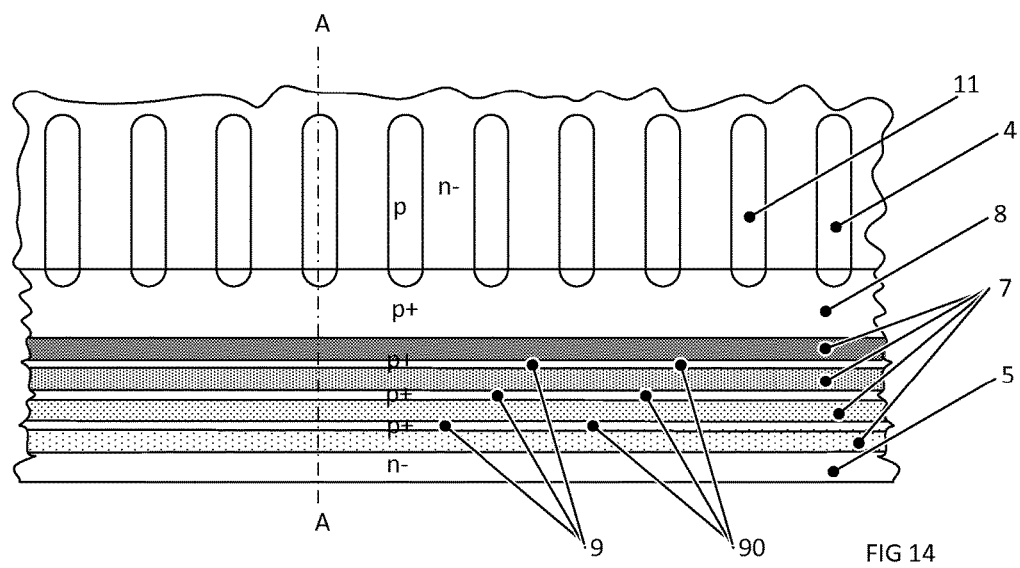
FIG. 14 shows a view in a plane parallel to the first main side 20 indicating a line A-A (as also shown in FIG. 5).

On the first main side 20 a p+ highly doped bar 8, which has a higher maximum doping concentration than the base layer 4, is arranged between the active cell region 10 and the termination region 12. The bar 8 is a ring shaped such that it encloses the active cell region 10 laterally, i.e. in a plane parallel to the first main side 20. The ring shaped bar 8 (bar 8 closed-in-itself and laterally, i.e. in a plane parallel to the first main side 20, enclosing the active cell region 10) can exemplarily have a design of a rectangle with rounded corners. The bar 8 is electrically connected to the first main electrode 2 via the base layer 4 or directly. The FIGS. 5 to 10 show a connection of the p bar 98 via the base layer 4 and to the first main electrode 2 and FIG. 13 shows a direct connection from the bar 8 to the first main electrode 2. Of course, a combination of such connections is also possible, i.e. in an exemplary embodiment, the bar 8 is connected to the base layer 4 and also directly connected to the first main electrode 2 or any other connection, by which the bar 8 is connected to the first main electrode 2 shall be covered by the invention. FIG. 14 shows another exemplary embodiment, in which the MOS cells 11 are indicated by the p base layer 4. FIG. 14 is a cut in a plane parallel to the first main side 20 in a depth, in which the p base layer 4, p+ bar 8, VLD layer 7 and protection layer 9 as three protection rings 90 are arranged (see also the line A-A in FIG. 5, which line is also shown in FIG. 14). The VLD layer is shown by the dotted area, the lighter dotted regions indicating the decreasing doping concentration towards the lateral sides (edges) of the device. The overlap of the base layer 4 and bar 8 shall indicate the connection of these two layers, by which the bar is connected to the first main electrode 2.

The bar 8 may have a width between 10 to 200 µm. Width shall correspond to a maximum diameter of a circle, which can be laid into the bar in a plane parallel to the first main side 20.

The bar 8 can be designed to be partially floating (by contacting the bar 8 to first main electrode 2 via the base layer 4; see FIGS. 5 to 10) or non-floating (the bar 8 directly contacting the first main electrode 2; see FIG. 13) depending on the optimum injection from the additional p-bar region desired or both connections are realized in the same device. The bar 8 may contact the first main electrode 2 at a bar contact area, which is at most 10% of the bar area at the first main side surface. By the introduction of such weakly contacted bars low on-state losses are achieved and high safe operating area (SOA) is maintained.

If a bar 8 is electrically connected to the first main electrode 2 via a base layer 4 (FIGS. 5 to 10), the connection is established in a connection area. This connection area is the area, in which said bar 8 adjoins the base layer 4. In another exemplary embodiment, the base layer 4 contact the bar 8 in a connection area, which is less than 1% said base layer surface area. If a bar 8 is electrically connected to the first main electrode 2 directly by placing the first main electrode 2 on the bar 8, the connection area can be adjusted. The first main electrode 2 may contact the bar 8 in the area which is less than 10% or even less than 1% of said bar surface area.

On the first main side 20 in the termination region 12 a VLD (variable-lateral-doping) layer 7 of p-dopant type is arranged, in which in the VLD layer the doping concentration decreases laterally (i.e. in a plane parallel to the first main side 20) towards the edge 14 of the device (notwithstanding local doping fluctuations which might occur due to the production method). The lateral decrease of doping concentration is available for all depths of the VLD layer 7. The VLD layer is connected to the bar 8. Exemplarily, the VLD layer 7 has a thickness of up to 15 µm.

Exemplarily, the VLD layer 7 is a contiguous layer surrounding the MOS cell region 10 and being contiguous in a direction of increasing distance from the MOS cell region 10, so that all areas of the VLD layer 7, and thereby also of the protection layer 9 are weakly connected to the first main electrode via the VLD layer 7 contacting the bar 8.

Exemplarily, the VLD layer 7 is a diffused layer, for which the doping concentration (doping profile, which shall be the doping concentration of the layer in depth direction, i.e. in a direction perpendicular to the first main side 20) decreases from a local maximum doping concentration continuously for greater depths from the first main side 20. Furthermore, the local maximum doping concentration of the VLD layer 7 (of such a doping profile) decreases with increasing distance, i.e. laterally, from the active cell region 10. Exemplarily also the thickness of the VLD layer varies such that for increasing distance from the active cell region 10 the thickness decreases. Thus, the VLD layer 7 has local maximum doping concentrations, which shall be the maximum doping concentration of a doping profile at any place in the VLD layer 7, and a maximum doping concentration, which shall be the maximum value of all doping concentrations in the VLD layer 7, i.e. also the maximum value of all local maximum doping concentrations.

Furthermore, on the first main side 20 a p+ doped protection layer 9 is arranged in the termination region 12 and within the variable-lateral-doping layer 7. The protection layer 9 has a higher maximum doping concentration than the (local) maximum doping concentration of the variable-lateral-doping layer in a region attached to the protection layer 9. Exemplarily, the protection layer 9 has a higher maximum doping concentration than all local maximum doping concentrations of the VLD layer 7.

The protection layer 9 may have a maximum doping concentration, which it at least 10 times, 100 times or 1000 times higher than the local maximum doping concentration of the variable-lateral-doping layer in a region attached to the protection layer 9 or at least 10 times, 100 times or 1000 times higher than the maximum doping concentration of the variable-lateral-doping layer, which is the absolute) maximum doping concentration.

The doping profile of the p dopant is modulated by the introduction of the protection layer 9. For a protection layer 9 having ring-shaped protection regions 90 this leads to a modulation of the doping concentration, i.e. higher doping concentration (protection ring 90) and lower doping concentration (VLD layer 7) alternate in a direction of increasing distance from the MOS cell region 10, overlaid with the decreasing doping concentration of the VLD layer with increasing distance from the MOS cell region 10. An inventive device with up to 5 protection rings or between 3 and 5 protection rings as protection regions already efficiently reduces the electric field in the termination region 12.

In an exemplary embodiment, the bar 8 and the protection layer 9 have the same maximum doping concentration or the same thickness or the same maximum doping concentration and the same thickness. The protection layer 9 may have a maximum doping concentration of at most $5*10^{18}$ cm$^{-3}$ or $5*10^{16}$ cm$^{-3}$ or even below $5*10^{15}$ cm$^{-3}$. The thickness of the protection layer 9 may be between 6 to 20 µm, exemplarily up to 9 µm. Exemplarily, the width of the protection layer 9 may be at most 20 µm.

Exemplarily, the protection layer 9 has a thickness, which is shallower than the thickness of the VLD layer 7. In an exemplary embodiment, the thickness of the protection layer may be up to 9 µm and the thickness of the VLD layer 7 up to 15 µm.

The FIGS. 6 to 14 show different embodiments of the same invention shown in FIG. 5. As shown in FIG. 6 the inventive device 1 may also be a reverse-conducting insulated gate bipolar transistor (RC-IGBT) 150, which differs from the MOSFET 100 disclosed above in that the RC-IGBT 150 comprises on the second main side 27 a second layer 55, which forms a collector layer for the IGBT. First and second layer 5, 55, which alternate on the second main side 27, contact the second main electrode 25, which forms a collector electrode for the RC-IGBT. The first main electrode 2 forms an emitter electrode for the RC-IGBT.

The RC-IGBT 150 may also be designed as a Bi-mode Insulated Gate Transistor (BIGT) (i.e. comprises p doped pilot regions) as described above for the prior art BIGTs, but having the inventive structure in and at the termination region 12 of bar 8, VLD layer 7 and protection layer 9.

Figure 8:
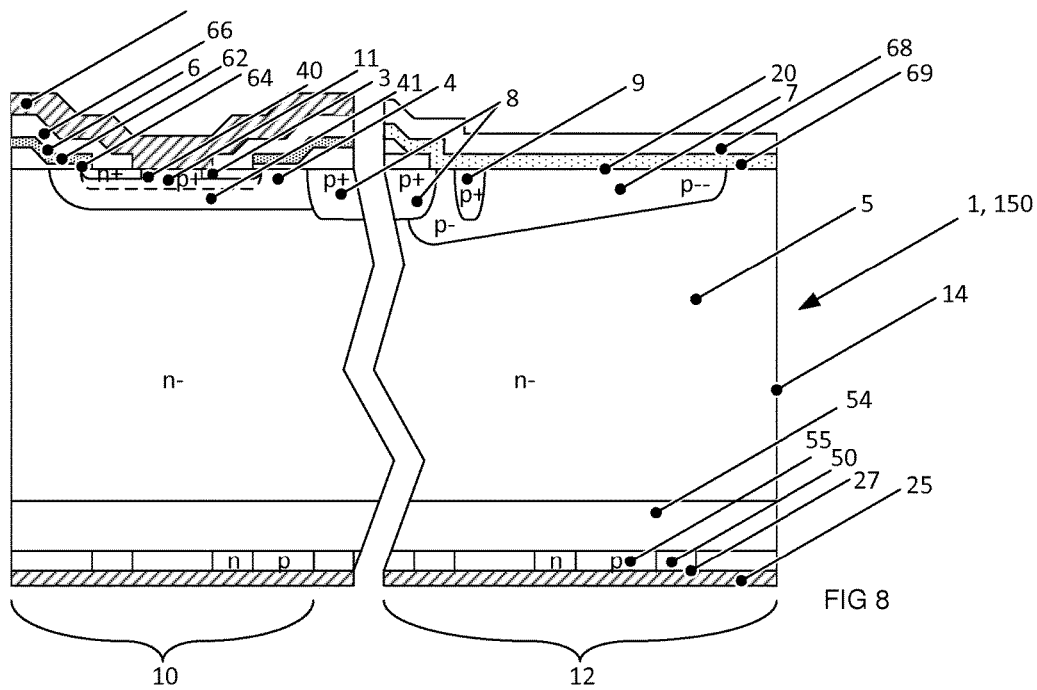
FIG. 8 shows a cross sectional view on an inventive reverse-conducting IGBT having a buffer layer.
Figure 11:
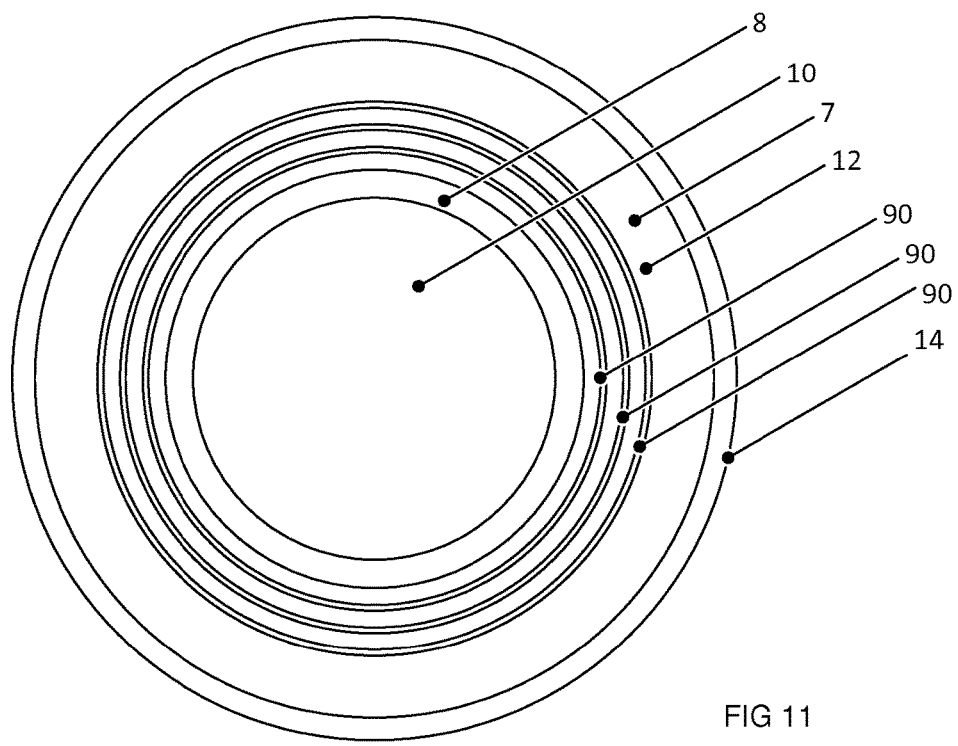
FIG. 11 shows a top view on an inventive reverse-conducting IGBT having three protection regions.

As shown in FIG. 8, in another embodiment the RC-IGBT 150 may further comprise an n type buffer layer 54, which is arranged between the drift layer 5 and the first and second layer respectively, and which buffer layer 54 has a higher doping concentration than the drift layer 5.

The buffer layer 54 has preferably a maximum doping concentration of at most $1*10^{17}$ cm$^{-3}$.

A features disclosed in the following are shown in the figures for a RC-IGBT 150, but can be also applied on an inventive MOSFET 100.

The protection layer 9 may comprise at least one ring-shaped region 90 (FIG. 11), i.e. a region forming a ring (in a plane parallel to the first main side 20) around the active cell region 10. The ring shall be a shape closed-in-itself, which surrounds the active cell region 10 in a plane parallel to the first min side 20. Exemplarily, the ring encloses the active cell region 10 in a constant distance. The device may also comprise a plurality of such rings, wherein all subsequent rings have a greater distance to the active cell region 10 (see also FIG. 7) and are separated from each other by a VLD layer 7.

Figure 12:
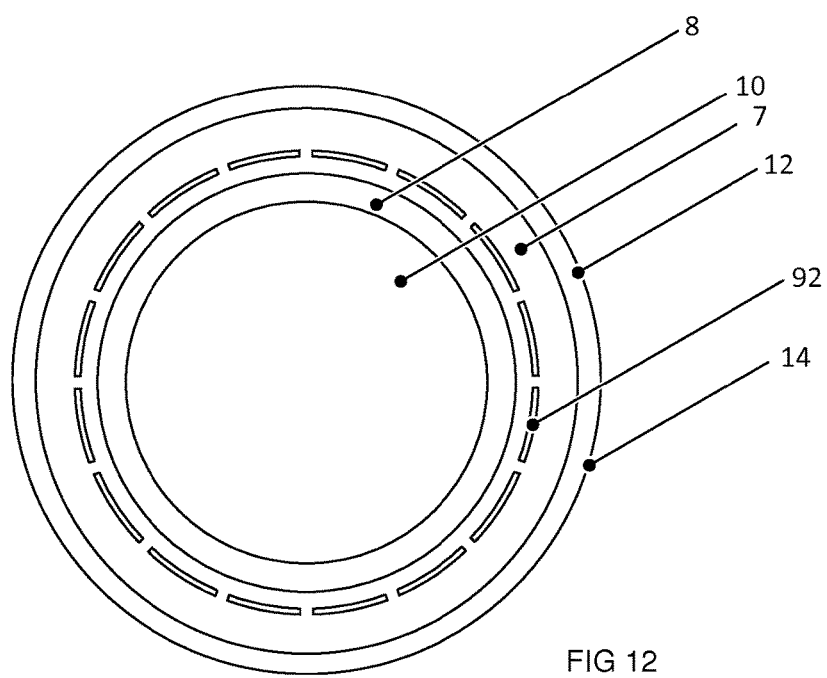
FIG. 12 shows a top view on an inventive reverse-conducting IGBT having a perforated ring of protection zones.

Alternatively, the protection layer 9 may comprise a plurality of protection zones 92, which surround the active cell region 10. Such protection zones may have in an exemplary embodiment a distance between two neighboured protection zones 92 of at most 50 µm or at most 20 µm (FIG. 12). In another embodiment, such protection zones 92 could be placed only at positions, at which high filament current may be expected, e.g. in the corners of a device for a device having e.g. a rectangular/square shape. Exemplarily, the protection zones 92 surrounding the active cell region 10 form a perforated ring having opening between neighboured protection zones 92 wherein the openings have a distance of at most 50 µm or at most 20 µm. The protection zones 92 of such a perforated ring may be arranged in the constant distance to the active cell region 10.

For a device comprising at least two rings (protection regions 90) or perforated rings, the width of neighboured protection region 90 or perforated rings of protection zones 92 may be constant or varying. In an exemplary embodiment, the width of successively following protection regions 90/perforated rings of protection zones 92 decreases in a direction towards the edge 14 of the device (FIG. 9). For a device comprising at least two rings (protection regions 90) or perforated rings, the width of each ring may be at most 20 µm.

For a device comprising at least three ring-shaped regions (self-contained regions) 90 or perforated rings, the distance between two neighboured protection regions 90 or perforated rings of protection zones 92 may be between 1 to 30 µm. This distance may be constant for all neighboured protection regions 90. The distance between two rings (i.e. the borders of the rings facing each other) may also increase with increasing distance from the active cell region 10 (FIG. 10).

The protection layer may also be a VLD layer as defined before such that the local maximum doping concentration decreases with increasing distance from the active cell region 10, i.e. towards the edge 14 of the device. Thus, such a device comprises two VLD layers 7 and 9, wherein the VLD layer 7 encloses the VLD protection layer 9.

A passivation layer 69 can be provided over the termination region of the substrate to equalize charge distribution across the termination region and to avoid local accumulations of charge which could cause zones of increased recombination or distort the local doping characteristics of the substrate and therefore also the local electric field gradients. It is known to use semi-insulating polysilicon (SIPOS) as a highly resistive passivation layer for junction termination regions. European patent application EP 0651435 describes a field plate made from a thin resistive film of semi-insulating polycrystalline silicon (SIPOS, also known as Polydox) deposited on the silicon substrate or sandwiched between two oxide layers in order to reduce thermo-mechanical stresses.

SIPOS is an example of a semi-insulating material. The term "semi-insulating" material is used in this application to refer to undoped semiconductor materials having a very high resistivity (typically greater than 107 Ωcm) and a very low intrinsic carrier concentration (relatively wide energy gap).

SIPOS is an oxygen-containing polycrystalline silicon film with an extremely high (but finite) resistivity, but which nevertheless has a small conductivity which allows the flow of a leakage current. Since the resistivity of a SIPOS layer 69 is the same in every lateral direction, the small leakage current makes the field at the silicon surface more uniform, thus relieving the surface electric field and providing a field-shield effect for the passivated surfaces. SIPOS films have the added advantage that they are electrically almost neutral (typically little or no doping), and therefore do not modify the space-charge regions of any adjacent junctions.

The SIPOS layer 69 may be covered by a further insulating layer 68, which may exemplarily be made of Silicon nitride. However, it is also possible to cover the termination region by a third insulating layer 67.

In another exemplary embodiment not shown in a figure, an n doped enhancement layer is arranged between the base layer 4 and the drift layer 5 for having lower on-state losses. The enhancement layer separates the base layer 4 from the drift layer 5 and it has higher doping concentration than the drift layer 5. The enhancement layer 41 can be present in planar gate designs as well as in trench gate designs.

In another embodiment, the conductivity types of the layers are switched, i.e. all layers of the first conductivity type are p type (e.g. the drift layer 5) and all layers of the second conductivity type are n type (e.g. the base layer 4).

The inventive reverse-conducting MOS device 1 can for example be used in a converter.

REFERENCE LIST

1 reverse-conducting MOS device
100 MOSFET
150 reverse-conducting insulated gate bipolar transistor
160 prior art BIGT
10 active cell region
11 MOS cell
12 termination region
14 edge of the device
2 first main electrode
20 first main side
25 second main electrode
27 second main side
3 source layer
4 base layer
40 contact layer
41 base region
5 drift layer
50 first layer
51 first region
52 first region width
53 drift layer thickness
54 buffer layer
55 second layer
56 second region
57 second region width
59 pilot region
580 pilot region border to the active region border
59 pilot region width
6 gate electrode
62 gate layer
64 first insulating layer
66 second insulating layer
67 third insulating layer
68 further insulating layer
69 SIPOS layer
7 variable-lateral-doping layer
8 bar
9 protection layer
90 ring-shaped region
92 protection zone

The invention claimed is:
1. A reverse-conducting MOS device, comprising:
a first main electrode on a first main side and a second main electrode on a second main side opposite to the first main side, the reverse-conducting MOS device has an active cell region and a termination region laterally surrounding the active cell region up to an edge of the reverse-conducting MOS device,
wherein the active cell region comprises a plurality of MOS cells, each of which comprises between the first main and second main side a source layer of a first conductivity type, a base layer of a second conductivity type, which is different from the first conductivity type, a drift layer of the first conductivity type and a first layer of the first conductivity type, which is higher doped than the drift layer, wherein in each MOS cell a gate electrode is arranged on the first main side, wherein on the first main side a bar of the second conductivity type, which has a higher maximum doping concentration than the base layer, is arranged between the active cell region and the termination region and encloses the active cell region in a plane parallel to the first main side, wherein the bar is electrically connected to the first main electrode, wherein on the first main side in the termination region a variable-lateral-doping layer of the second conductivity type is arranged, in which for all depths in the variable-lateral-doping layer the doping concentration decreases towards the edge of the reverse-conducting MOS device, which variable-lateral-doping layer is connected to the bar, wherein on the first main side a protection layer of the second conductivity type is arranged in the variable-lateral-doping layer, which protection layer has a higher maximum doping concentration than the maximum doping concentration of the variable-lateral-doping layer in a region attached to the protection layer.

2. The reverse-conducting MOS device according to claim 1, wherein the bar is electrically connected to the first main electrode via the base layer or directly at a bar contact area which is at most 10% of the maximum area of the bar.

3. The reverse-conducting MOS device according to claim 2, wherein the protection layer comprises at least one ring-shaped region surrounding the active cell region, and the protection layer has a maximum doping concentration, which it at least 10 times higher than the maximum doping concentration of the variable-lateral-doping layer in a region attached to the protection layer.

4. The reverse-conducting MOS device according to claim 3, wherein the protection layer has a maximum doping concentration of at most $5*10^{18}$ cm$^{-3}$, and the bar and the protection layer have at least one of the same maximum doping concentration and the same thickness.

5. The reverse-conducting MOS device according to claim 4, wherein the bar has a width between 10 to 200 μm, and the protection layer has a width of at most 20 μm.

6. The reverse-conducting MOS device according to claim 5, wherein the protection layer comprises a plurality of protection zones, which surround the active cell region, in particular such that the distance between two neighbored protection zones is at most 50 μm.

7. The reverse-conducting MOS device according to claim 6, wherein the width of successively following protection regions decreases in a direction towards the edge of the reverse-conducting MOS device.

8. The reverse-conducting MOS device according to claim 1, wherein the protection layer comprises at least one ring-shaped region surrounding the active cell region.

9. The reverse-conducting MOS device according to claim 1, wherein the protection layer has a maximum doping concentration, which it at least 10 times higher than the maximum doping concentration of the variable-lateral-doping layer in a region attached to the protection layer.

10. The reverse-conducting MOS device according to claim 1, wherein the protection layer has a maximum doping concentration of at most $5*10^{18}$ cm$^{-3}$.

11. The reverse-conducting MOS device according to claim 1, wherein the bar and the protection layer have at least one of the same maximum doping concentration and the same thickness.

12. The reverse-conducting MOS device according to claim 1, wherein the bar has a width between 10 to 200 μm.

13. The reverse-conducting MOS device according to claim 1, wherein the protection layer has a width of at most 20 μm.

14. The reverse-conducting MOS device according to claim 1, wherein the protection layer comprises a plurality of protection zones, which surround the active cell region, in particular such that the distance between two neighbored protection zones is at most 50 μm.

15. The reverse-conducting MOS device according to claim 1, wherein the protection layer is a variable-lateral-doping layer, in which for all depths in the protection layer the doping concentration decreases towards the edge of the reverse-conducting MOS device.

16. The reverse-conducting MOS device according to claim 1, wherein the protection layer comprises at least two ring-shaped regions and the distance between two neighboured protection regions is between 1 to 30 μm.

17. The reverse-conducting MOS device according to claim 1, wherein the width of successively following protection regions decreases in a direction towards the edge of the reverse-conducting MOS device.

18. The reverse-conducting MOS device according to claim 1, wherein the protection layer comprises at least three ring-shaped regions and in that the distance between successively following protection regions increases in a direction towards the edge of the reverse-conducting MOS device.

19. The reverse-conducting MOS device according to claim 1, wherein the termination region is covered by a semi-insulating layer.

20. The reverse-conducting MOS device according to claim 1, wherein the reverse-conducting MOS device is a MOSFET or a reverse-conducting insulated gate bipolar transistor or a Bimode Insulated Gate Transistor.

* * * * *